United States Patent [19]

Hipple et al.

[11] Patent Number: 4,883,968

[45] Date of Patent: Nov. 28, 1989

[54] ELECTRON CYCLOTRON RESONANCE ION SOURCE

[75] Inventors: James E. Hipple, Lexington; Gerald L. Dionne, South Hamilton, both of Mass.; Yasuhiro Torii, Atsugi, Japan; Masaru Shimada; Iwao Watanabe, both of Ishida, Japan

[73] Assignees: Eaton Corporation, Cleveland, Ohio; Nippon Telegraph and Telephone Corporation, Kanagawa, Japan

[21] Appl. No.: 202,141

[22] Filed: Jun. 3, 1988

[51] Int. Cl.[4] .............................................. H01J 37/08

[52] U.S. Cl. ................................ 250/423 R; 250/427; 313/360.1; 313/363.1; 315/111.81

[58] Field of Search ................... 250/423 R, 425, 427; 313/360.1, 363.1; 315/39, 111.81; 376/121, 127, 128, 142

[56] References Cited

U.S. PATENT DOCUMENTS 4,598,231 7/1986 Matsuda et al. ................ 250/423 R
4,703,180 10/1987 Taya .................................... 250/425
4,714,834 12/1987 Shubaly ............................... 250/427
4,782,235 11/1988 Lejeune et al. ..................... 376/127
4,793,961 12/1988 Ehlers et al. ........................ 376/127

OTHER PUBLICATIONS

"Microwave Ion Source for Ion Implantation", by N. Sakudo.

"Very High Current ECR Ion Source for an Oxygen Ion Implanter", by Torii et al.

*Primary Examiner*—Jack I. Berman

*Attorney, Agent, or Firm*—Watts, Hoffmann, Fisher & Heinke

[57] ABSTRACT

An electron cyclotron resonance ion source for an ion implanter. The source includes an ionization chamber surrounded along its length by an electromagnet. A number of extraction electrodes at an output end of the ionization chamber allow positively charged oxygen ions to pass through apertures in the electrodes. The uniformity of the axially aligned magnetic field in the ionization chamber is extended through the extraction electrode by a magnetically permeable electrode and through use of non-magnetically permeable material to mount others of said electrodes.

15 Claims, 7 Drawing Sheets

ELECTRON CYCLOTRON RESONANCE ION SOURCE

TECHNICAL FIELD

The present invention relates to a ion source for an ion implanter used in ion beam treatment of a workpiece.

BACKGROUND ART

One prior art technique for introducing dopants into a silicon wafer is to direct an ion beam along a beam travel path and selectively position silicon wafers to intercept the ion beam. This technique dopes the wafer with controlled concentrations of the ion material.

One example of a commercial ion implanter is the Eaton NV 200 Oxygen Implanter. This prior art ion implanter utilizes an oxygen ion source having a cathode that includes a filament for providing electrons for ionizing oxygen molecules. Electrons emitted by the cathode are accelerated through a region containing oxygen gas in controlled concentrations. The electrons interact with the gas molecules, yielding energy to the molecules which ionizes the molecules. Once ionized, the charged oxygen molecules are accelerated and shaped to form a well-defined oxygen ion beam for silicon wafer implantation. An ion source utilizing a cathode filament is disclosed in U.S. Pat. No. 4,714,834 which issued in the name of Shubaly and which is incorporated herein by reference.

Alternate proposals for ion source construction include the use of a microwave ion source that does not require a cathode or cathode filament. A microwave-powered ion source excites free electrons within an ionization chamber at a cyclotron resonance frequency. Collision of these electrons with gas molecules ionizes those molecules to provide ions and more free electrons within the chamber. These ions are then subjected to an accelerating electric field and exit the chamber in the form of an ion beam.

The theory and operation of a microwave ion source are discussed in two printed publications entitled, "Microwave Ion Source For Ion Implantation" to Sakudo, *Nuclear Instruments and Methods In Physics Research,* B21 (1987), pgs. 168–177 and "Very High Current ECR Ion Source For An Oxygen Ion Implanter" to Torii, et al., *Nuclear Instruments and Methods In Physics Research.* B21 (1987), pgs. 178–181. The disclosure of these two printed publications is incorporated herein by reference.

The ion sources disclosed in the two aforementioned printed publications includes an ion chamber surrounded by structure for providing a magnetic field for confining an electron plasma within the ion chamber. The necessity of providing a generally axial magnetic field within the ion producing chamber is recognized. It is a prerequisite for the electron cyclotron resonance effect and reduces the frequency with which electrons impact the walls of the ionization chamber. Such impact not only increases the temperature of the chamber, but also results in inefficient utilization of the microwave energy supplied to the ion source.

The low energy ions which are produced in the region of the plasma chamber where the microwave energy is introduced will drift in spiralling orbits about the magnetic field lines. Therefore, in order to make a large fraction of these ions available for extraction, the magnetic field should remain largely non-divergent until beyond the extraction region of the chamber.

Both references disclose embodiments of an ion generation chamber which have one or more encircling solenoids for creating an axially aligned magnetic field within the ion chamber. For an ion chamber suitable for retrofitting with the aforementioned NV 200 Oxygen Implanter, the use of a solenoid for generation of a uniform magnetic field produces a mis-match in size between the existing implanter and the ion source.

FIG. 13 of the Sakudo reference discloses an alternate system wherein a magnetic coil for providing an axial magnetic field is surrounded by an iron or high permeable metal to provide a magnetic circuit for focusing the magnetic field within the ion chamber. A second proposal shown in FIG. 13 of Sakudo is the use of an iron acceleration electrode at the exit portion of the ion chamber. Sakudo presents data indicating the ion source constructed in accordance with this disclosure has been used in combination with a commercial ion implanter with adequate results.

DISCLOSURE OF THE INVENTION

The present invention also addresses the problem of defining a magnetic field in an electron cyclotron resonance (ECR) ion source. The solution proposed by Applicant recognizes the importance of extending the region of axial magnetic field alignment through an extraction electrode and electron suppression electrode into the region beyond the ionization chamber.

A microwave excited ion beam source constructed in accordance with the invention includes a cylindrical ion chamber having a generally longitudinal axis and a gas inlet for supplying controlled concentrations of oxygen to the chamber. At one end of the enclosure microwave energy is introduced from a microwave generator and at an opposite end of the enclosure, ions generated due to gas/electron collisions within the chamber are extracted.

A magnetic field defining structure includes one or two annular coils supported along their length outside the enclosure. When energized, the coil produces a generally axially aligned magnetic field within the chamber.

A multi-holed aperture plate in a flange at the end of the chamber provides an exit path for the ions. Its holes are aligned with holes in aperture plates in two other flanges or electrodes held at suppression and at ground potential, respectively, in an extraction electrode and insulator assembly similar to that disclosed by Shubaly in the patent herein referenced. The outermost, or ground aperture, and the uppermost portion of the electrode into which it is installed are low reluctance paths for the magnetic field from the chamber. Magnetically permeable material is also used in selected regions of the other two electrodes, as described below, in order to define the remainder of the preferred return path for the magnetic field.

An additional aspect of the invention is the technique for mounting the inner aperture plate which allows positively charged oxygen ions to exit from within the chamber. All three aperture plates are supported by flanges that are nested to align the three aperture plates generally parallel to each other with respect to the ionization chamber. The inner most aperture plate is supported by a flange having an outer portion constructed of magnetically permeable material. This outer portion is abutted by the magnetic field defining structure of the ion source. A stainless steel insert is welded to this magnetically permeable portion of the supporting flange and directly supports the inner most aperture plate which in a preferred embodiment is constructed from molybdenum.

The intermediate aperture, called the suppression aperture, and most of the electrode which supports it, are also made of non-magnetic materials. However, an annular region in the tapered portion of the electrode is made of magnetically permeable material. This material partially bridges what would otherwise be a wide gap between the magnetic material in the ground electrode and that in the outer portion of the extraction electrode, thereby further reducing the reluctance of the intended return path for the magnetic field; i.e., the longer path through the aperture plates to the outermost mild steel electrode before diverging radially outward back towards the magnetic field defining structure of the ion source.

An additional contribution to the shaping of the magnetic field is provided by a samarium cobalt ring magnet which is embedded in the output flange of the ion chamber. The outside diameter of this ring magnet is slightly larger than the inside diameter of the mild steel portion of the adjacent extraction flange. The magnet is axially magnetized and is installed so that its field adds in the extraction region to the field produced by the electromagnet coil.

A modular construction approach used in putting together the ion source facilitates calibration and maintenance procedures needed to produce a uniform ion beam. The magnetic field defining structure including the coil and coil enclosure can be disconnected from the magnetically permeable aperture plate mounting flange and rolled away from the ion chamber along a track specially designed for this purpose. Once the ion chamber and aperture plate mounting structure is exposed, the ion chamber can be disconnected from the extraction aperture plate by means of a locking mechanism similar to that used on a camera lens mount. The ion chamber is rotated and then lifted away from the extraction plate and mounting flange.

Once the ion chamber is removed the electrode and insulator assembly are accessible and can be easily removed from the implanter for alignment or replacement of the aperture. A specially constructed fixture or jig is used to align the apertures. Once the aperture plates are appropriately aligned, the ion chamber can be reconnected to the mounting flange and the magnetic field defining structure rolled back into place.

Other important features of the invention relate to the mechanism for coupling microwave energy to the interior of the ion chamber. Multiple dielectric blocks mounted within the vacuum of the ionization chamber form a window that transmits microwave energy from a microwave generator to the inside of the ion chamber.

The construction and arrangement of the window provides a highly efficient coupling of microwave energy to the high density plasma inside the chamber while sealing the chamber. These ceramic blocks expand and contract slightly with temperature changes but the use of a radial "O" ring seal around an outermost quartz block accommodates this expansion and contraction with such temperature variations.

From the above it is appreciated that one aspect of the invention is a new and improved ECR ion source having provision for improved magnetic field uniformity throughout the interior region of an ion generation chamber. This and other objects, advantages and features of the invention will become better understood from a detailed description of a preferred embodiment which is described in conjunction with the accompanying drawings.

BEST MODE FOR CARRYING OUT THE INVENTION

Figure 1:
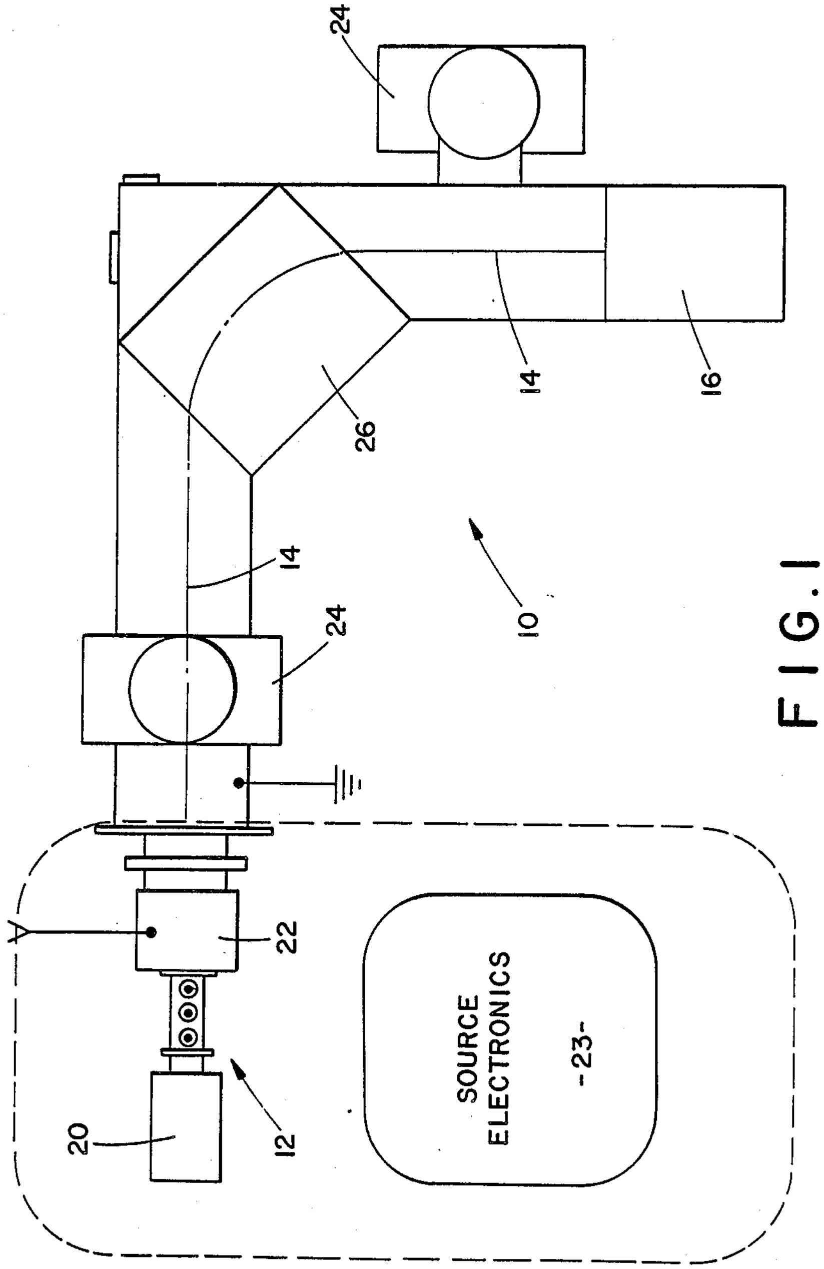
FIG. 1 is a schematic depiction of an ion implanter system.

Turning now to the drawings, FIG. 1 is a schematic overview depicting an ion implantation system 10 having an ion source 12 for providing ions to form an ion beam 14 that impinges on a workpiece at an implantation station 16. At one typical implantation station, the ion beam 14 impacts silicon wafers (not shown) to selectively introduce ion impurities which dope the silicon wafers and produce a semi-conductor wafer. In the ion implantation system 10 depicted in FIG. 1, the ion beam 14 traverses a fixed travel path and control over ion implantation dose is maintained by selective movement of the silicon wafers through the ion beam 14.

One example of a prior art implantation system 10 is the model NV 200 implanter sold commercially by eaton Corporation. This implantation system utilizes an ion source similar to that disclosed in the aforementioned and incorporated '834 patent to Shubaly.

The ion source 12 depicted in FIG. 1 utilizes a different mode of ion production. A microwave generator 20 transmits microwave energy to an ionization chamber 22. The ionization chamber 22 is connected to the existing structure of the NV 200 implanter. Ions exiting the chamber 22 have an initial energy (40–50 kev, for example) provided by accelerating electrodes forming a portion of the source 12. Control over the accelerating potentials and electromagnetic coil energization is maintained by source electronics 23 schematically depicted in FIG. 1.

Ions exiting the source 12 enter a beam line that is evacuated by two vacuum pumps 24. The ions follow the beam path 14 to an analyzing magnet 26 which bends the charged ions toward the implantation station 16. Ions having multiple charges and different species ions having the wrong atomic number are lost from the beam due to ion interaction with the magnetic field set up by the analyzing magnet 26. Ions traversing the region between the analyzing magnet 26 and the implantation station 16 are accelerated to even higher energy by electrodes (not shown) before impacting wafers at the implantation station.

Control electronics (not shown) monitor the implantation dose reaching the implantation station 16 and increase or decrease the ion beam concentration based upon a desired doping level for the silicon wafers at the implantation station. Techniques for monitoring beam dose are known in the prior art and typically utilize a Faraday cup which selectively intersects the ion beam to monitor beam dose.

Figure 2:
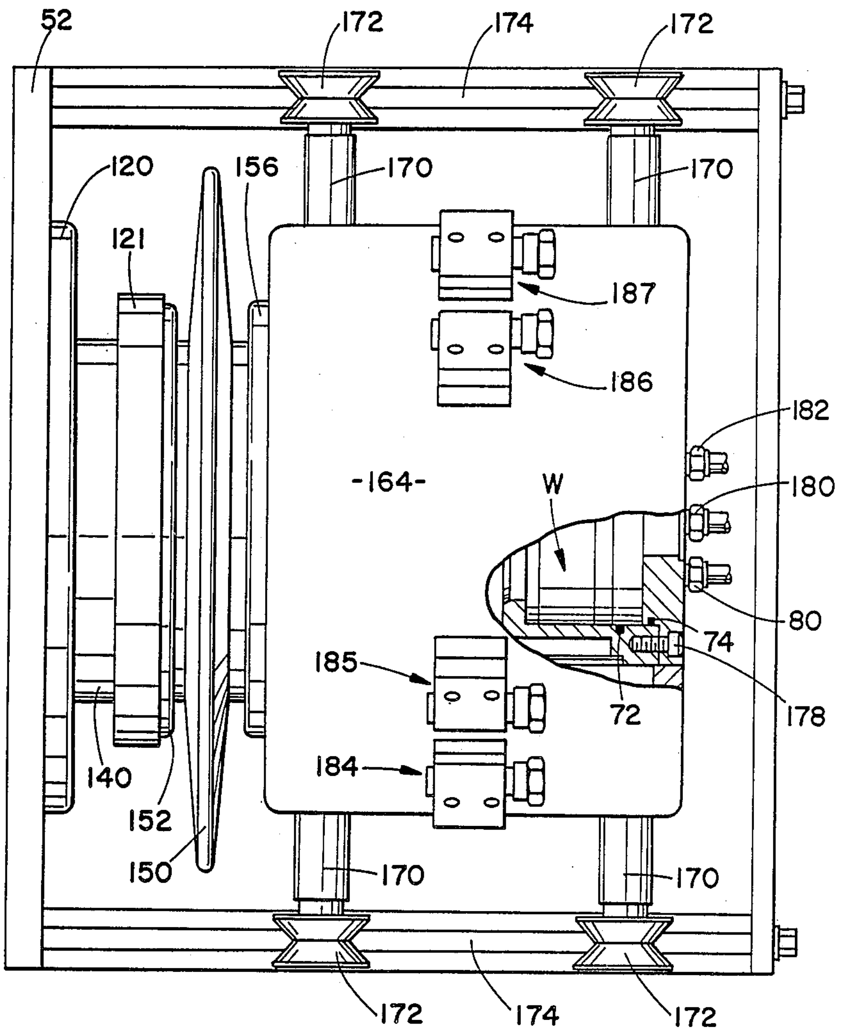
FIG. 2 is a plan view of an ion source for use in conjunction with the FIG. 1 implanter system.
Figure 3:
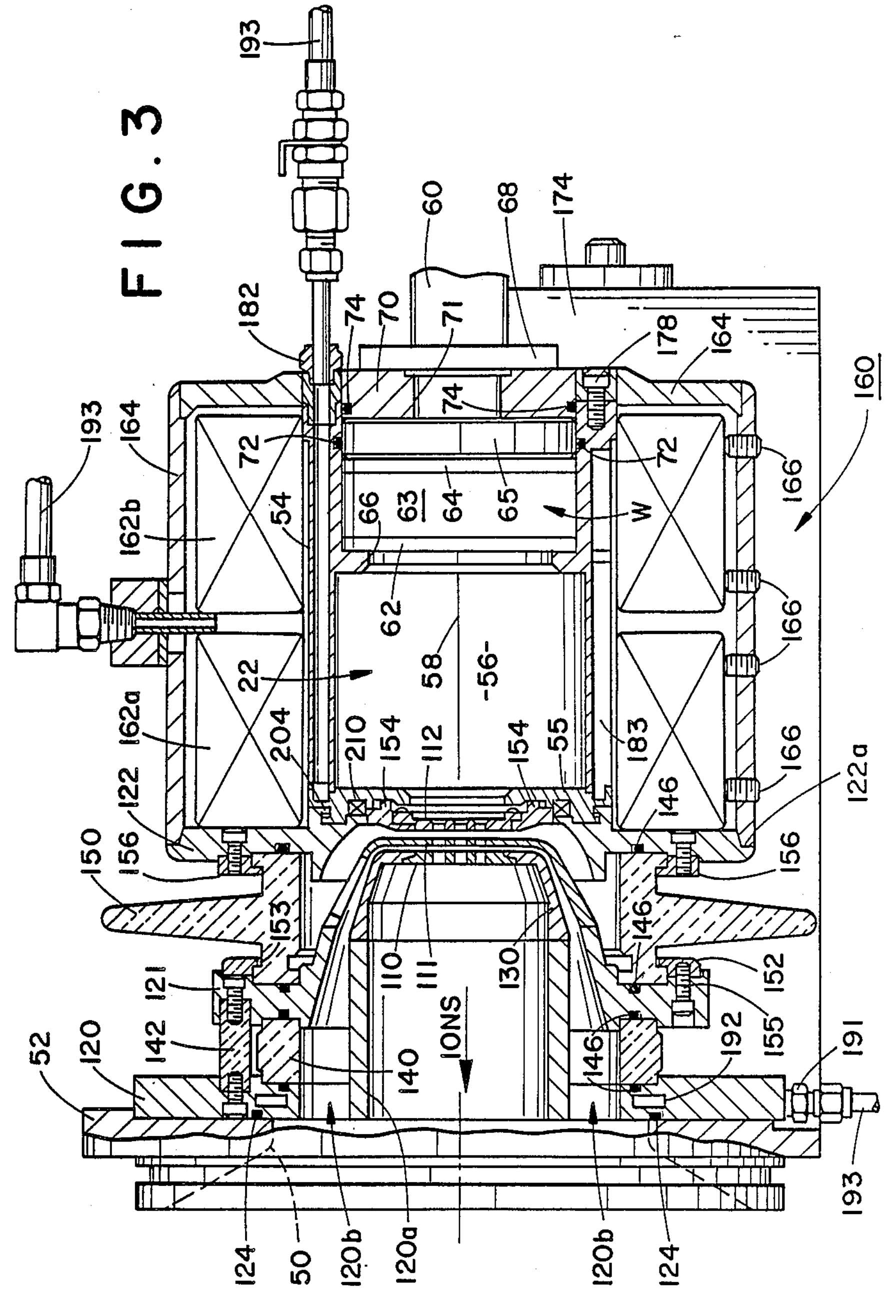
FIG. 3 is a partially sectioned view of the FIG. 2 ion source.

The engagement between the existing NV 200 implanter and an ion source 12 constructed in accordance with the present invention is depicted in FIGS. 2 and 3. The ion beam implanter 10 has an input opening 50 defined by a grounded beam line flange 52 to which the source 12 is coupled.

A generally cylindrical stainless steel chamber housing 54 has an inwardly facing wall 56 that defines the cylindrical ionization chamber 22 having a major axis 58. A microwave input end of the chamber 22 removed from the implanter flange 52 receives ionization energy from the generator 20 via a waveguide 60 having an impedance tuned to the particular frequency output by the generator. The preferred microwave generator comprises a Model No. S-1000 commercially available from American Science and Technology Inc.

The waveguide 60 directs microwave energy into the ionization chamber 22 through a window W having three dielectric disks 62–64 and a single quartz disk 65 positioned inside the housing 54 by a radially inward extending stainless steel flange 66 and chamber input flange 70. The disk 64 is constructed of alumina and the disks 63, 62 are both Boron Nitride and have thicknesses of 25 mm and 6 mm, respectively. The disk 62 abutting the flange 66 degrades with use due to ion and electron contact from the chamber 22 and is periodically replaced while the disk 63 is permanent.

The chamber input flange 70 is constructed of magnetically permeable material (preferably mild steel). The wave guide 60 includes an end flange 68 that abuts this flange 70 and transmits electromagnetic energy through a rectangular opening 71 having the same dimensions as the interior of the waveguide to allow microwave energy transmitted through the waveguide 60 reach and pass through the dielectric disks 62–64.

In order to increase the lifetime of the ion source and achieve higher ion current, a relationship between the structure of the dielectric window W and ion current has been investigated.

A right hand circularly polarized microwave is mainly absorbed by the ECR plasma in the chamber 22. The dielectric constant Ep of the plasma for this wave along the static magnetic field is given by:

$$Ep = 1 - \frac{(Wpe/W)^2}{1 - Wce/W} \quad (1)$$

where W, Wpe, Wce are the incident microwave frequency the plasma frequency and the electron cyclotron frequency. The dielectric constant Ep becomes larger as the plasma density becomes higher ($W_{ce} > w$). Therefore, large, strong reflection of the microwave from the plasma can be expected. To reduce the reflection, the multi-layer dielectric disks are used as an impedance matching tuner, by optimizing the thickness and the dielectric constant of the disks.

Figure 10:
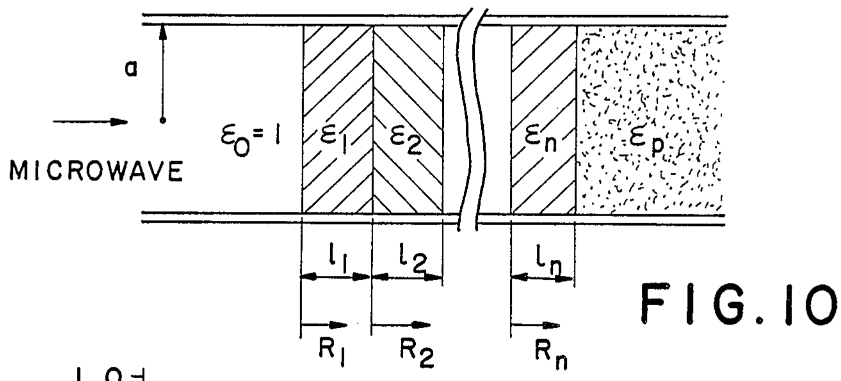
FIG. 10 is a schematic of a series of microwave transmission disks that form a window for coupling microwave energy to an ionization chamber.

The calculation of reflection ratio for a multilayer window system which include n dielectric plates as seen in FIG. 10 is as follows. The impedance $R_1$ seen at the face of the first dielectric plate is:

$$R_1 = Z_1 \frac{R_2 + jZ_1 \tan\theta_1}{Z_1 + jR_2 \tan\theta_1} \quad (2)$$

where $Z_1$ is the characteristic impedance of a waveguide filled with a first dielectric plate of thickness $l_1$, $R_2$ is the impedance seen at the face of the second plate, $\Theta_1$ is $2\pi d_1/\lambda_1$, $\lambda_1$ is the wavelength in the waveguide. The impedances $R_2$, $R_3$ . . . can be calculated as same as $R_1$.

The reflection coefficient is $$T = \left| \frac{R_1 - 1}{R_1 + 1} \right|^2 \quad (3)$$

Boron Nitride was chosen as the dielectric material for the plate 62 facing the plasma, because it has a high melting point and good thermal conductivity. Quartz and alumina were used as a vacuum sealing plate and impedance matching plate because of their high dielectric constants.

Figure 11:
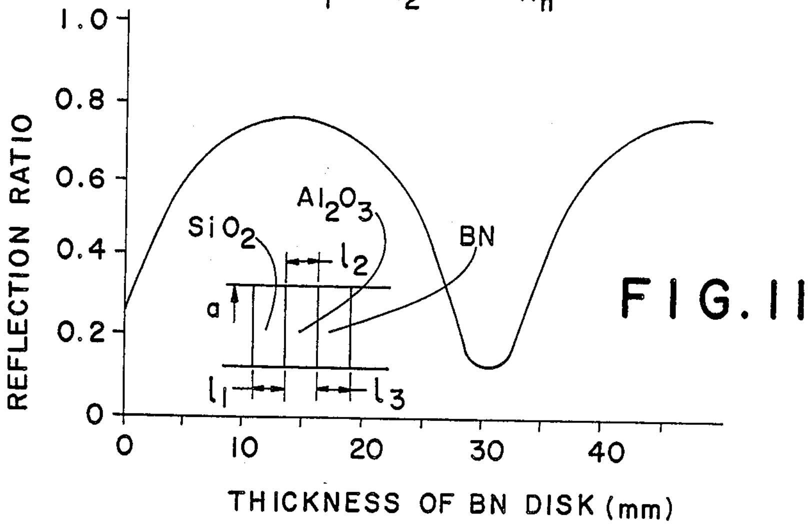
FIG. 11 is a graph of reflection ratios for different thickness transmission disks.

After some calculation and by substituting dimensions of the disclosed window structure, one obtains the relation between the combined thickness of the boron nitride blocks and the reflection coefficient for $W_{CE}/W = 1.1$, $(W_{pE}/W)^2 = 13$. It is shown in FIG. 11 that the reflection coefficient varies periodically with the thickness of BN, it is clear that the impedance matching is an important design consideration in constructing the window W.

Figure 12:
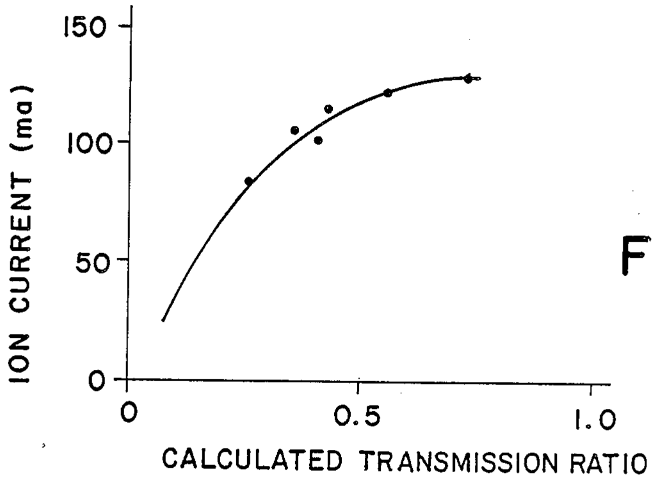
FIG. 12 is a graph of ion current for microwave transmission efficiency.

In FIG. 12 the relation between the calculated reflection ratio and the ion current obtained experimentally is shown. The ion current increases with increasing transmission ratio. BN thickness is chosen near the second minimum of the transmission rate for a high tolerance against backstreaming electrons as shown in FIG. 11. Using this window structure, the lifetime of this ion source is more than 200 hours.

Figure 5:
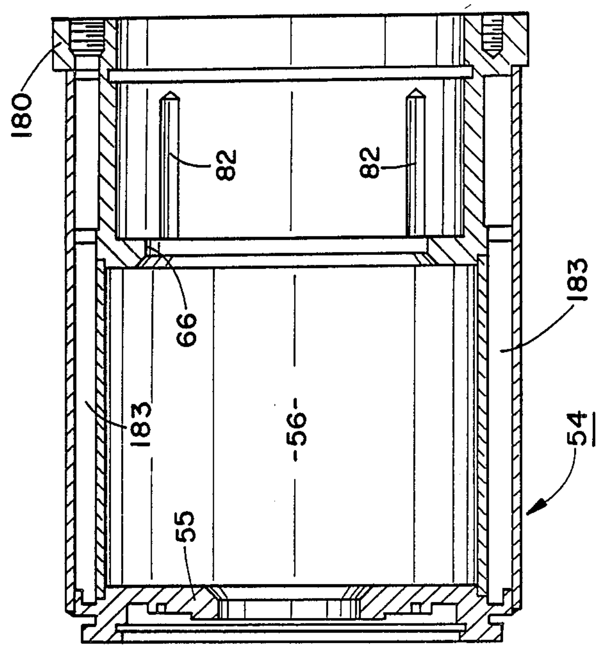
FIG. 5 is a section view of an ionization chamber housing.
Figure 6:
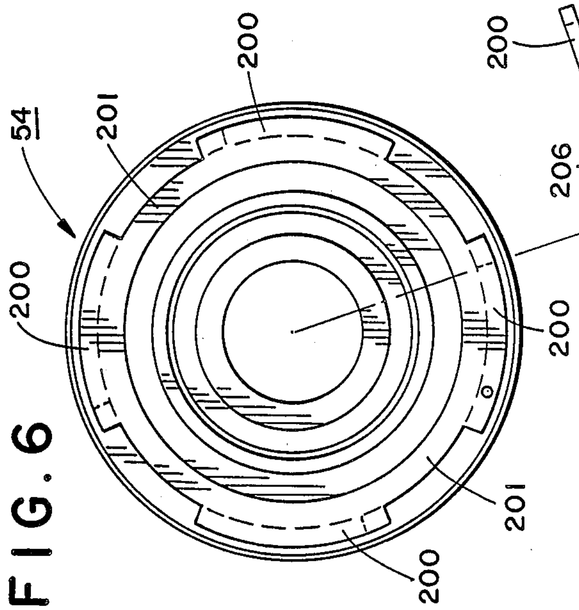
FIG. 6 is an end elevation view of the FIG. 5 housing.

A radial seal 72 engages the quartz disk 65 and maintains a vacuum within the ionization chamber 22. The seal 72 is supported within a groove 73 (FIG. 5) in the housing 54. The dielectric disks 62–64 that abut the quartz disk are free to expand and contract with temperature since the quartz disk is not rigidly fixed axially within the chamber 22. A second electrically conductive seal 74 is supported in a groove in the chamber input flange 70 and prevents microwave energy entering the chamber 22 via the waveguide 60 from leaking from the system 10.

A fitting 80 (seen most clearly in FIG. 4), routes gas from a conduit (not shown) through the stainless steel housing 54 into the chamber 22 for interaction with free electrons present within the chamber. In a preferred use of the invention, the fitting 80 routes oxygen molecules in controlled concentrations to allow the implanter 10 to selectively dope silicon wafers with oxygen ions.

In use, the chamber 22 is in fluid communication with the beam line and therefore must be evacuated prior to operation. Air can be trapped between the dielectric disks 62–64 in the chamber 22, delaying the attainment of high vacuum in the source. To avoid this two grooves 82 are machined in the chamber wall 56 to allow air between the disks to be more easily pumped out of the chamber 22.

Within the chamber 22, a certain level of free electrons are always present and are initially excited by the microwave energy supplied by the generator 20. The excited electrons spiral along paths generally parallel to the major axis 58 of the chamber 22. The spiralling is caused due to the presence of a magnetic field generally aligned with the axis 58. The electrons engage oxygen molecules and ionize those molecules to produce additional free electrons in the chamber 22 for further oxygen ionization.

At an ion extraction end of the ionization chamber 22, three spaced extraction plates 110–112 define an exit path for ions in the chamber 22. The plates 110–112 are mounted to the implantation station 10 by three nested mounting flanges 120–122 interposed between the beam line flange 52 and the chamber 22.

A first mounting flange 120 is grounded and coupled to the accelerator beam line flange 52. An O-ring seal 124 maintains a vacuum within the beam line along the interface between the first mounting flange 120 and the beam line flange 52. Radially inward from the "O" ring 124 the flange 120 defines a cylindrical portion 120*a* having an axis generally coincident with the major axis 58 of the ionization chamber. The section view of FIG. 3 passes through cutouts 120*b* in the flange 120 that increase the pumping conductance and improve the vacuum in the region of the flanges 120–122.

The flange 120 is constructed of stainless steel and defines an end face to which an aperture plate support 130 is brazed. The support 130 is constructed of mild steel and helps extend the region of axial magnetic field alignment outside the ionization chamber 22. Coupled to the support 130 is a grounded re-entrant aperture plate 110 that is also constructed of mild steel. The aperture plate 110 is coupled to the support 130 by connectors to allow the plate 110 to be removed periodically since the holes defined by the plate are gradually eroded as ions impinge upon the aperture edges. This also allows the plates to be re-oriented relative the flange 120 as the plates 110–112 are aligned.

An intermediate extraction plate 111 is maintained at an electric potential of approximately −2.5 kilovolts with respect to the flange 120. This extraction plate 111 is supported by a second mounting flange 121 coupled to the first flange 120. The second mounting flange 121 abuts an electrically insulating spacer element 140 having 0-ring seals 142, 144 for maintaining vacuum along the beam path. A preferred spacer element 140 is constructed of alumina oxide. During construction, the second mounting flange 122 is positioned against the spacer element 140 and a number of fiberglass epoxy connectors 142 are used to connect the flanges 120, 121 together. The intermediate extraction plate 111 prevents electrons from the implanter 10 from entering the ionization chamber. An interface between the spacer element 140 and the flanges 120, 121 is sealed by "O" rings 146.

An innermost extraction plate 112 is held at a potential of approximately 40 to 50 kilovolts with respect to ground. The innermost extraction plate 112 is coupled to a mounting flange 122 and held in a generally parallel orientation to the first and second extraction plates 110, 111. The third mounting flange 122 is spaced from the intermediate flange 121 by a second insulating spacer element 150. Additional O-rings 146 between the spacer element 150 and flanges 121, 122 maintain vacuum along the ion beam path.

The flange 122 is constructed of magnetically permeable material and for example in a preferred embodiment is constructed of mild steel. The spacer element 150 is constructed of a cross-linked polystyrene material. During construction of the ion source, the spacer element 150 is placed within a notch or groove defined by the mounting flange 121. A split ring 152 having a retaining lip 153 is then placed around the spacer element 150 and aligned so that holes in the ring 152 align with openings in the flange 121. Threaded connectors 155 are then screwed through the openings around the periphery of the flange 121 and into the ring 152. In a similar fashion, a second retaining ring 156 and plurality of connectors couple the third mounting flange 122 to the spacer element 150.

Brazed to the third mounting flange 122 at a radially inward position is a stainless steel insert 154 that directly supports the innermost extraction plate 112. The use of the stainless steel insert 154 helps define an axially aligned magnetic field in the region of the extraction plates 110–112. The two innermost extraction plates 111, 112 are constructed of molybdenum.

Figure 8:
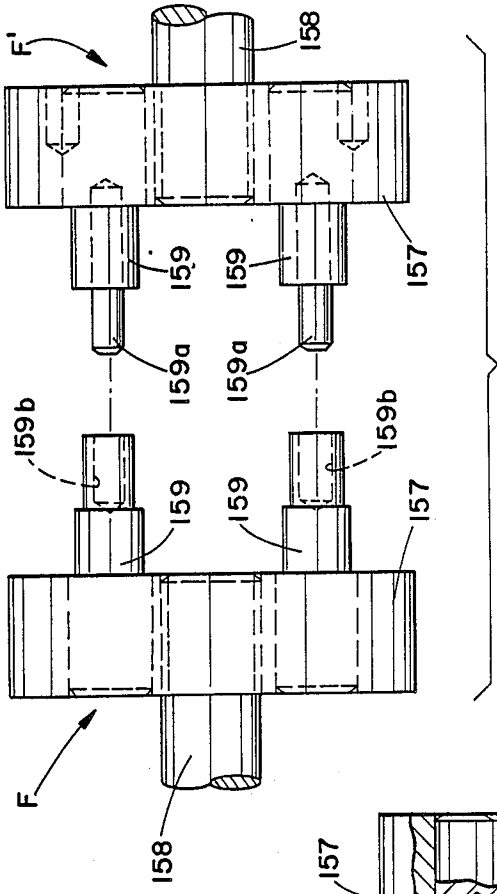
FIG. 8 is an elevation view of two fixtures for aligning three aperture plates at an exit end of the ionization chamber.
Figure 9:
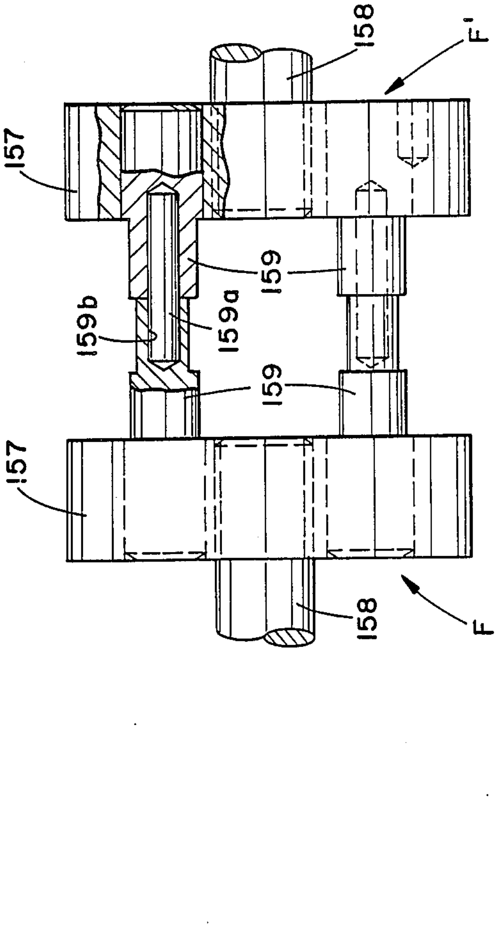
FIG. 9 is an elevation view of the fixtures as they appear when mated to properly align apertures in the aperture plates.

During construction of the source, proper orientation of the two aperture plates 110–112 is accomplished with two special fixtures F, F' (FIGS. 8 and 9) used to align the apertures of the plates 110–112. Each plate 110–112 is coupled to its associated support by connectors that allow the plate to be rotated about the axis 58 before the plate is securely fixed in a particular orientation. Different hole patterns in the plates 110–112 are used for different implanter applications. Typical hole patterns are a center hole with either six or twelve equally spaced other openings arranged about the center opening.

The two fixtures F, F' have a base 157, a handle 158 for maneuvering the base 158 and a plurality of pins 159 extending from the base 157. During alignment of the plates 110–112 they are loosely fixed to their respective flanges and the holes are generally aligned. The pins 159 of one fixture, F for example, are pushed through the plate 110 and the plate 110 is rotated until the pins 159 of this fixture F can be inserted into the openings of the intermediate plate 111. From the opposite side of the plate 111 the Fixture F' is used to re-orient the plate 112 and specifically used to orient the plate 112 until the pins 159 on the fixture F' engage the pins 159 of the fixture F. When this occurs an extension 159*a* fits inside a groove 159*b* of the fixture F.

A magnetic field within the ionization chamber 22 is in part created by an electromagnetic 160 (FIG. 3) having two energization coils 162*a*, 162*b* wrapped along the axial extent of the ionization chamber 22. A magnet support 164 preferably has walls of mild steel and supports the coil 162 in spaced relation to the ionization chamber 22. A series of radially extending support pins 166 extend through the walls of the support 164 and allow adjustment of the relative position between the coil 162 and the ionization chamber 22.

The coil support 164 defines bearings 170 (FIG. 4) on opposed sides of the coil support 164 which journal rollers 172 for rotation. Fixed rails 174 support the rollers 172 and coil support 164 for back and forth movement along a path generally parallel to the major axis 58 of the ionization chamber. Once the ionization chamber 22 has been coupled to the mounting flange 122 by a mechanism described below, the electromagnet 160 can be rolled into place to the position depicted in FIG. 2. The coil support engages a notch 122*a* defined in the mounting flange 122 and connectors 178 couple the support 164 to the ionization chamber housing 54. The magnetically permeable flange 122, the magnet support 164, and the chamber flange 70 confine the magnetic field generated due to coil energization when the source 12 is in operation.

Figure 4:
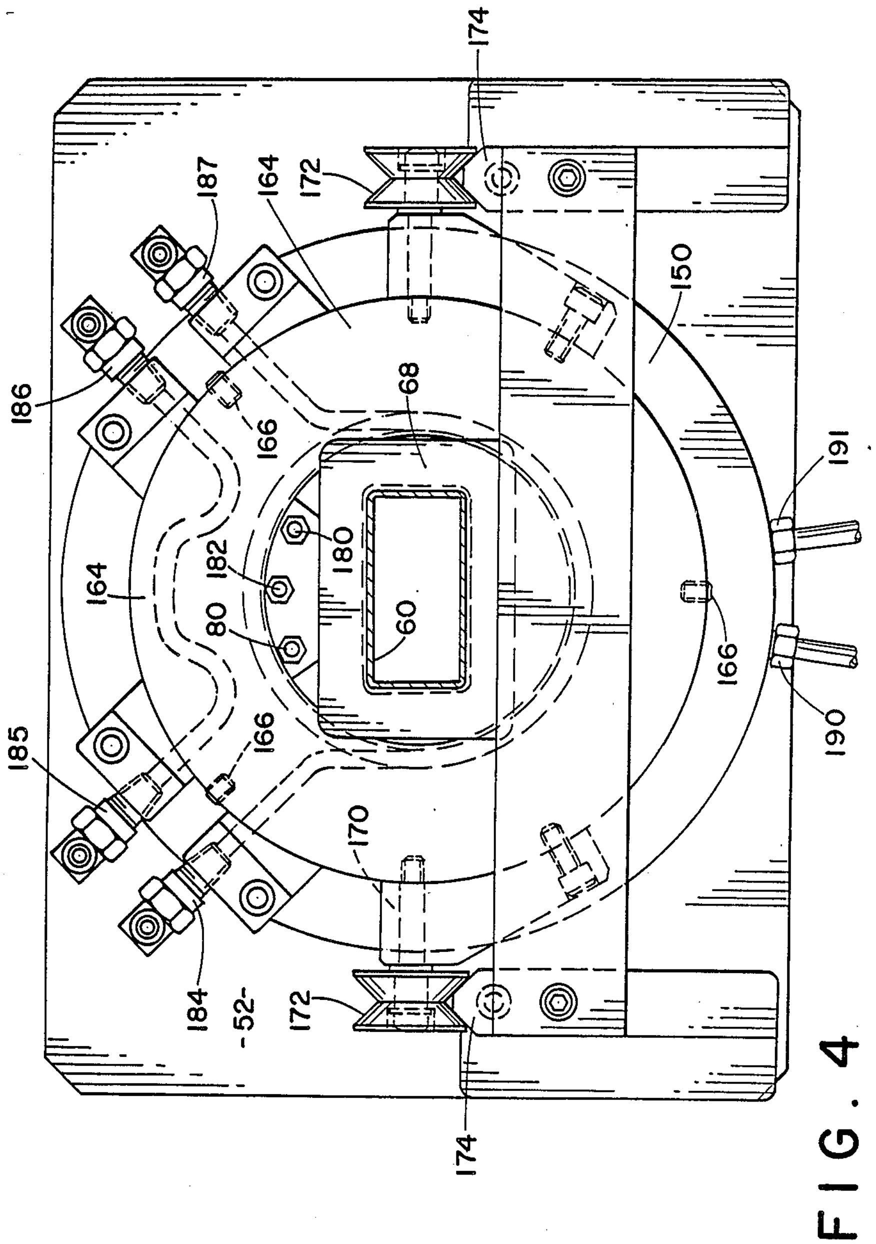
FIG. 4 is an end elevation view of the ion source shown in FIGS. 2 and 3.

FIGS. 2–4 depict a plurality of fittings for routing cooling fluid, most preferably water into contact with the ion source. As seen most clearly from the end elevation view of FIG. 4, a fitting 180 allows water to be routed into an annular passageway 183 in the housing 54 surrounding the chamber 22. The water exits the container 54 via an exit fitting 182. Additional fittings 184–187 are coupled to the coil support 164 to allow coolant to be directed into the enclosure defined by the coil support. Finally, fittings 190,191 enable the outermost mounting flange 120 to be cooled by directing water into and out of an annular groove 192 defined in the flange 120.

Most of the microwave energy which is delivered to the plasma chamber to stimulate ionization will ultimately bombard the walls of the chamber in the form of ultraviolet radiation. The enumerated fittings allow flexible water carrying conduits 193 to be connected to the ion source during operation so that the ultraviolet radiation does not unduly raise the temperature of the chamber walls. It has been found that it is desirable to shield the aperture plate 112 from unnecessary ultraviolet bombardment and in this regard it is seen that the housing 54 has an end wall 55 that overhangs the plate 112 to partially shield said plate.

By disconnecting the conduits 193 from the source and removing the microwave components magnet 160 can be pushed back away from the ionization chamber 22. When so exposed, the chamber enclosure 54 can be disconnected from the flange 122 to expose the extraction plates 110–112. Prior to moving the magnet 160, however, a rail extension is added to the rail 174 shown in the Figures.

Figure 7:
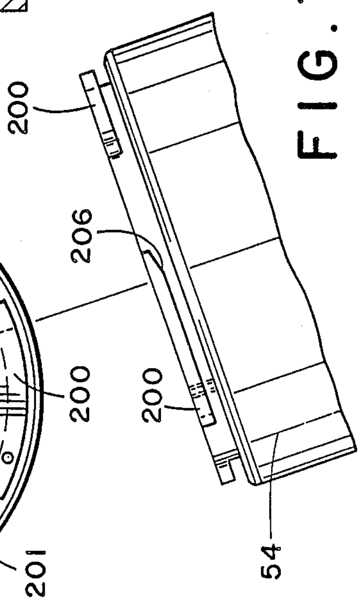
FIG. 7 is a side elevation view of one end of the ionization chamber housing.

An outwardly facing surface of the wall 55 defines a series of equally spaced tabs 200 (FIG. 7) supported by a circumferentially extending ridge 201 which can be inserted into a groove 202 in the flange 122. The entire housing 54 is then rotated so that the tabs 200 are trapped behind corresponding tabs 204 in the flange 122. This mechanism is akin to a breech lock mechanism in a camera lens mount. The tabs 200 have a beveled face 206 (FIG. 7) that provides a camming action as the housing 54 is twisted once the ride 201 is pushed against the flange 122.

Conforming surfaces of the housing wall 55 and flange 122 define a circular slot which supports a samarium cobalt magnet ring 210. A magnetic field in the axial direction of at least 875 Gauss is needed where microwave energy enters the chamber to satisfy the electron cyclotron resonance condition needed to ionize sufficient gas molecules. This field should continue to remain largely axial through the region defined by the aperture plate 111. In combination, use of the magnet 210, the electromagnets 162*a*, 162*b*, the mild steel support 164, mild steel flange 122, mild steel aperture plate 110, stainless steel insert 154 and molybdenum plates 111, 112 result in an extension of predominantly axially aligned magnetic lines of force to the region of the plate 110.

OPERATION

In operation, free electrons within the chamber 54 are excited by microwave energy from the generator 20 and cause the electrons to traverse spiralling paths within the chamber 22. They will encounter oxygen molecules routed into the ion chamber 22 and ionize molecules generating more free electrons and positively charged ions. In the region between the extraction plates 110, 112, a strong electric field having field lines extending from the positively biased plate 112 to the grounded plate 110 is created. Ions exiting the chamber 22 through the apertures in the chamber plate 112 are swept away from the ion chamber 22 and obtain an energy of approximately 40 kev. Energization of the electromagnetic coils 162*a*, 162*b* in combination with the field created by the magnet 210 and choice of materials for the flange 122 and enclosure 164 result in an extension of the axially aligned magnetic field through the extraction plates 110–112. The field lines then bend around and enter the electromagnet via the mild steel flange 122. During ion source operation, the various flexible conduits 193 route coolant, typically water, into the ion source 12 and carry away heat due to ultraviolet radiation impingement upon the inner walls of the chamber.

In the event realignment of the aperture plates 110–112 or other maintenance procedures are necessary, the couplings allow the fluid conduits 193 to be disconnected so that the electromagnet can be rolled away from the ion chamber 22 along the two parallel rails 174. The chamber 22 can then be disconnected and lifted away from the flange 122 to allow ready access to the mounting flanges 120–122 and aperture plates 110–112. One standard procedure is to entirely disconnect the flanges and plates as a unit from the grounded flange 52 for maintenance.

Table I below indicates performance criteria for the ECR source 12 constructed in accordance with the invention. These parameters are compared with a prior art system utilizing a source such as that depicted in the Shubaly patent.

TABLE 1

ECR and Prior Art Performance Comparison on NV200

| Parameter | ECR | Prior Art |
|---|---|---|
| Extraction Voltage (kV) | 45 | 40 |
| Extraction Current (mA) | 86 | 146 |
| Suppression Voltage (kV) | 2.5 | 2.6 |
| Suppression Current (mA) | 2.4 | 5.8 |
| Acceleration Voltage (kV) | 155 | 160 |
| Acceleration Current (mA)* | 55 | 70 |
| Wafer Current (mA)** | 48.3 | 49 |
| Beam Line Temperature (×C.) (upstream from implantation) | 42 | 60–70 |

*includes estimated leakage current of 3 mA through cooling water lines
measured by implantation station calorimeter The performance parameters are similar with the exception that the ECR source 12** results in a sharp reduction in extraction current for the same wafer implantation dose. Transportation of the beam through the implanter is more efficient as indicated by the acceleration currents and the lower temperature of the beam line upstream from the implantation station.

Other advantages achieved through practice of the invention stem from elimination of the filament used in prior art ion sources. This increases the operational life of the source by an order of magnitude and results in greater operating stability with less operator intervention.

The present invention has been described with a degree of particularity. It is the intent, however, that the invention include all modifications and alterations from the disclosed design falling within the spirit or scope of the appended claims.

We claim:

1. A microwave energized ion source comprising:
(a) structure defining a cylindrical ion producing chamber having a longitudinal axis and a gas inlet for supplying an oinizable gas in controlled concentrations into the chamber, said structure including an ion beam exit opening at one end of said chamber and an energy input opening at an opposite end of said chamber;
(b) magnetic field defining structure comprising one or more annular coils supported along the length of the ion producing chamber which, when energized provides a generally axially aligned magnetic field in the ion producing chamber, said magnetic field defining structure having an outer, coil enclosing structure comprising magnetically permeable material for shaping the magnetic field generated by coil energization;
(c) ion accelerating structure including inner, intermediate and outer spaced aperture plates covering the exit opening and having aligned openings providing exit paths for ions exiting the chamber, said outer aperture plate constructed from a more magnetically permeable material than the inner and intermediate spaced aperture plates for extending a region of axial magnetic field alignment through said inner and intermediate spaced aperture plates; and
(d) structure for exciting ionizing electrons in the chamber by application of microwave frequency energy to the chamber, said structure including one or more microwave transmitting elements supported at the energy input opening of said ion producing chamber.

2. The ion source of claim 1 additionally comprising an annular, permanent magnet that produces a magnetic field in the region of the inner aperture plate which adds to the generally axially aligned magnet field produced by the annular coils radially inward from said permanent magnet and subtracts from the magnetic field produced by the coils radially outward of said permanent magnet.

3. The ion source of claim 1 where the ion beam exit opening is defined by a generally circular opening in a chamber end wall, and wherein said chamber end wall abuts an inner aperture plate support for the inner aperture plate; said inner aperture plate support constructed of magnetically permeable material that bounds a region occupied by the one or more annular coils.

4. The ion source of claim 3 where the inner aperture plate support comprises a radially outer portion of magnetically permeable material that bounds the region occupied by the one or more annular coils and a radially inner portion that supports the inner aperture plate and has less magnetic permeability than the radially outer portion.

5. The ion source of claim 3 wherein the chamber end wall defines an end wall surface having a circular ridge supporting a plurality of radially extending spaced tabs and wherein the support for the inner aperture plate defines a groove configured to accept the tabs of the chamber end wall as the chamber is moved into contact with the support and further defines tab retaining portions that engage the tabs of the end wall when the chamber end wall and flange are relatively rotated.

6. The ion source of claim 1 wherein the outer aperture plate comprises mild steel and the inner and intermediate aperture plates comprise molybdenum.

7. A microwave energized ion source comprising:
(a) structure defining a cylindrical ion producing chamber having a longitudinal axis and a gas inlet for supplying an ionizable gas in controlled concentrations into the chamber, said structure defining an ion beam exit opening at one end of said chamber and an energy input opening at an opposite end of said chamber;
(b) magnetic field defining structure comprising an annular coil supported along the length of the ion producing chamber which, when energized provides a generally axially aligned magnetic field in the ion producing chamber, said magnetic field defining structure having an outer, coil enclosing structure comprising magnetically permeable material for shaping the magnetic field generated by coil energization;
(c) ion accelerating structure including an outer aperture plate and one or more other aperture plates spaced between the outer aperture plate and the exit opening and having aligned openings providing exit paths for ions exiting the chamber, said outer aperture plate comprising a magnetically permeable material to extend a region of axial magnetic field alignment through said one or more other aperture plates; and
(d) structure for exciting ionizing electrons in the chamber by application of a microwave frequency signal to the chamber, said structure including three microwave transmitting elements supported at the energy input opening of said ion producing chamber where a first outermost quartz microwave transmitting element receives microwave energy from a source, a second innermost boron nitride microwave transmitting element couples the microwave energy to the chamber interior and a third alumina impedance matching microwave transmitting element interposed between the quartz and the boron nitride microwave transmitting elements to match the overall impedance of the three microwave transmitting elements with a predicted impedance of a high density plasma within the chamber for efficient ion production within the chamber.

8. A microwave energized ion source comprising:
(a) structure defining a cylindrical ion producing chamber having a longitudinal axis and a gas inlet for supplying an ionizable gas in controlled concentrations into the chamber, said structure including an ion beam exit opening at one end of said chamber and an energy input opening at an opposite end of said chamber;
(b) magnetic field defining structure comprising
(i) one or more annular coils supported along the length of the ion producing chamber which, when energized provides a generally axially aligned magnetic field in the ion producing chamber;

(ii) coil enclosing structure comprising magnetically permeable material for shaping the magnetic field generated by energization of the one or more annular coils; and (ii) an annular, permanent magnet for producing a magnetic field in the region of the inner aperture plate which adds to the generally axially aligned magnetic field produced by the one or more annular coils radially inward from said permanent magnet and substracts from the magnet field produced by the one or more annular coils radially outward of said permanent magnet;

(c) ion accelerating structure including inner, intermediate and outer spaced aperture plates covering the exit opening and having aligned openings providing exit paths for ions exiting the chamber, said outer aperture plate comprising a magnetically permeable material to extend a region of generally axial magnetic field alignment through said inner and intermediate spaced aperture plates; and (d) structure for exciting ionizing electrons in the chamber by application of microwave frequency energy to the chamber, said structure including one or more microwave transmitting elements supported at the energy input opening of said ion producing chamber.

9. The ion source of claim 8 wherein the permanent magnet abuts an end wall of the ion producing chamber radially outward from a generally circular exit opening in the end wall.

10. A microwave energized ion source comprising:

(a) structure defining a cylindrical ion producing chamber having a longitudinal axis and a gas inlet for supplying an ionizable gas in controlled concentrations into the chamber, said structure including an ion beam exit opening at one end of said chamber and an energy input opening at an opposite end of said chamber;

11. The ion source of claim 10 wherein the inner and intermediate aperture plate are constructed of molybdenum.

12. The ion source of claim 10 wherein the structure defining the ion producing chamber comprises an end wall surface having a circular ridge supporting a plurality of radially extending spaced tabs that can be inserted into a groove in the radially outer portion of the first flange and rotated to lock said tabs in place by a plurality of overhanging tab retaining portions of said first flange.

(b) magnetic field defining structure comprising one or more annular coils supported along the length of the ion producing chamber which, when energized provides a generally axially aligned magnetic field in the ion producing chamber, said magnetic field defining structure having an outer, coil enclosing structure comprising magnetically permeable material for shaping the magnetic field generated by coil energization;

(c) ion accelerating structure including inner, intermediate and outer spaced aperture plates covering the exit opening and having aligned openings providing exit paths for ions exiting the chamber, said outer aperture plate comprising a magnetically permeable material to extend a region of axial magnetic field alignment through said inner and intermediate spaced aperture plates;

(d) aperture plate mounting structure comprising three generally concave, nested mounting flanges that are coupled together by insulators, and where a first of the flanges that supports the inner aperture plate defines:

(i) a radially outer portion that abuts the magnetic field defining structure when the ion beam source is operating constructed of magnetically permeable material to help confine the magnetic field in the vicinity of the magnetic field defining structure; and (ii) a stainless steel insert radially inward of said radially outer portion for supporting the inner aperture plate through which charged ions exit the cylindrical ion producing chamber; and (e) structure for exciting ionizing electrons in the chamber by application of microwave frequency energy to the chamber, said structure including one or more microwave transmitting elements supported at the energy input opening of said ion producing chamber.

13. A microwave energized ion source comprising:

(a) structure defining a cylindrical ion producing chamber having a longitudinal axis and a gas inlet for supplying an ionizable gas in controlled concentrations into the chamber, said structure including an ion beam exit opening at one end of said chamber and an energy input opening at an opposite end of said chamber;

(b) magnetic field defining structure comprising one or more annular coils supported along the length of the ion producing chamber which, when energized provides a generally axially aligned magnetic field in the ion producing chamber, said magnetic field defining structure having an outer, coil enclosing structure comprising magnetically permeable material for shaping the magnetic field generated by coil energization;

(c) ion accelerating structure including an outer aperture plate and one or more other aperture plates spaced between the outer aperture plate and ion beam exit opening which cover the exit opening and include aligned apertures to provide exit paths for ions exiting the chamber, said outer aperture plate comprising a magnetically permeable material to extend a region of axial magnetic field alignment through said one or more other aperture plates;

(d) aperture plate mounting structure comprising a plurality of generally concave, nested mounting flanges separated from each other by insulators, and where a first flange that supports an innermost aperture plate define a radially outer portion that abuts the magnetic field defining structure when the ion beams source is operating and is constructed of magnetically permeable material to help define the magnetic field in the vicinity of the magnetic field defining structure; and (e) structure for exciting ionizing electrons in the chamber by application of microwave frequency energy to the chamber, said structure including one or more microwave transmitting elements supported at the energy input opening of said ion producing chamber.

14. The ion source of claim 13 wherein a second flange supporting the outer aperture plate includes a generally cylindrical portion that bounds an ion travel path downstream from the outer aperture plate; said generally cylindrical portion comprising a magnetically permeable material that extends a region of axial magnetic field alignment through the outer aperture plate.

15. The ion source of claim 14 further comprising a permanent magnet which is annular and abuts the radially outer portion of the first flange.

* * * * *

UNITED STATES PATENT AND TRADEMARK OFFICE

CERTIFICATE OF CORRECTION

PATENT NO. : 4,883,968

DATED : November 28, 1989

INVENTOR(S) : JAMES E. HIPPLE, et al.

It is certified that error appears in the above-identified patent and that said Letters Patent is hereby corrected as shown below:

Column 13, lines 39-49, these lines consisting of Claim 11 (lines 39-41) and Claim 12 (lines 41-49) were inadvertently placed between Claim 10(a) and 10(b) and should be correctly put into sequential order following the end of Claim 10(e) in Column 14, line 17.

Signed and Sealed this

Twenty-sixth Day of February, 1991

*Attest:*

HARRY F. MANBECK, JR.

*Attesting Officer* *Commissioner of Patents and Trademarks*